United States Patent
Kanegae (10) Patent No.: US 6,831,018 B2
(45) Date of Patent: Dec. 14, 2004

(54) METHOD FOR FABRICATING SEMICONDUCTOR DEVICE

(75) Inventor: Kenshi Kanegae, Takatsuki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/128,314

(22) Filed: Apr. 24, 2002

(65) Prior Publication Data

US 2003/0040192 A1 Feb. 27, 2003

(30) Foreign Application Priority Data

Aug. 21, 2001 (JP) ........................................ 2001-249880
Aug. 21, 2001 (JP) ........................................ 2001-249883

(51) Int. Cl.[7] ............................................ H01L 21/302
(52) U.S. Cl. ...................... 438/706; 438/710; 438/714; 438/725
(58) Field of Search .................. 438/706, 710–711, 438/714, 725, 694–696, 700, 709, 718, 717, 734, 723, 724, 737–738, 740, 743–744

(56) References Cited

U.S. PATENT DOCUMENTS 5,702,869 A * 12/1997 Chien et al. ............... 430/313
5,811,358 A * 9/1998 Tseng et al. ............... 438/725
6,097,095 A * 8/2000 Chung ....................... 257/774
6,559,486 B2 * 5/2003 Ueda ......................... 257/217
2002/0090827 A1 * 7/2002 Yokoshima ................. 438/714

FOREIGN PATENT DOCUMENTS

| JP | 4-30518 | 2/1992 |
| JP | 6-236864 | 8/1994 |
| JP | 6-168917 A | 9/1994 |
| JP | 09-162162 | 6/1997 |
| JP | 11-97421 | 4/1999 |
| JP | 11-145111 | 5/1999 |
| JP | 2000-223490 | 8/2000 |

* cited by examiner

Primary Examiner—Long Pham
Assistant Examiner—Ginette Peralta
(74) Attorney, Agent, or Firm—McDermott Will & Emery LLP (57) ABSTRACT

After forming a resist pattern on an insulating film deposited on a semiconductor substrate, the insulating film is subjected to plasma etching using an etching gas including carbon and fluorine with the resist pattern used as a mask. A polymer film having been deposited on the resist pattern during the plasma etching is subjected to a first stage of ashing with a relatively low chamber pressure and relatively low plasma generation power by using an oxygen gas or a gas including oxygen as a principal constituent. A residual polymer present on the insulating film in completing the first stage of the ashing is subjected to a second stage of the ashing with a relatively high chamber pressure and relatively high plasma generation power by using an oxygen gas or a gas including oxygen as a principal constituent.

15 Claims, 8 Drawing Sheets

METHOD FOR FABRICATING SEMICONDUCTOR DEVICE

BACKGROUND OF THE INVENTION

The present invention relates to a method for fabricating a semiconductor device. More particularly, it relates to a method for fabricating a semiconductor device including a step of subjecting a polymer film, which has been deposited on an insulating film through plasma etching using an etching gas including carbon and fluorine, to ashing using an oxygen gas or a gas including oxygen as a principal constituent.

In accordance with recently improved refinement of semiconductor integrated circuit devices, it has become necessary to form a contact hole with a smaller diameter. On the contrary, since the depth of a contact hole has not been largely changed, a technique to form a contact hole with a high aspect ratio (the depth of the contact hole/the diameter of the contact hole) has become necessary.

Also, since a resist film used for forming a hole pattern has been reduced in its thickness, it is significant how the value of (the depth of the contact hole)/(the thickness of the resist film to be etched) is increased, namely, how the value of resist selectivity (=(the etching rate of an insulating film used for forming the contact hole)/(the etching rate of the resist film) is increased.

For example, when the resist selectivity is not sufficiently high, most of the resist film is etched before forming the contact hole, and hence, the contact hole cannot be formed in a good shape. Specifically, the contact hole may have a trumpet-shaped upper opening or adjacent contact holes may be connected to each other because the resist film is removed.

As one method for attaining sufficiently high resist selectivity for forming a contact hole in a good shape, a rigid deposited film is formed by using, as an etching gas, a PFC (perfluorocarbon) gas with a high C/F ratio, such as a $C_2F_6$ gas (with a C/F ratio of 2/6), a $C_4F_8$ gas (with a C/F ratio of 4/8) or a $C_5F_8$ gas (with a C/F ratio of 5/8), or by employing carbon-rich etching conditions. Thus, high resist selectivity can be attained.

Recently, however, oxide film etching process with higher resist selectivity is employed, and hence, there is a problem that a sufficient etching rate of a polymer film formed on the resist film cannot be attained by conventional ashing even if the power is increased.

Further, ashing using an oxygen gas including a fluorine gas for attaining the etching rate invites surface roughness of the wafer or shaving of the underlying substrate.

Now, a conventional method for forming a contact hole will be described with reference to FIGS. 7A through 7C and 8A through 8C.

Figure 7A:
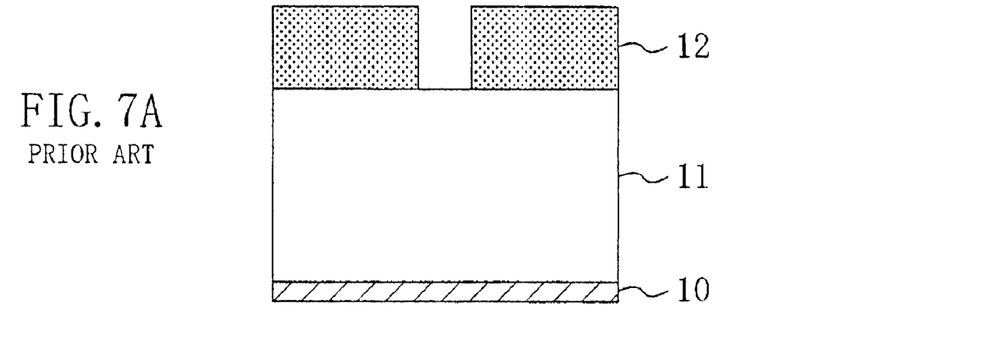
FIGS. 7A, 7B and 7C are cross-sectional views for showing procedures in a conventional method for fabricating a semiconductor device.

First, as shown in FIG. 7A, a resist pattern 12 having a contact hole opening is formed on a silicon oxide film 11 formed on an underlying layer 10 made from an etching stopper film of a silicon nitride film or the like, a plug of polysilicon, tungsten or the like, or a lower interconnect.

Figure 7B:
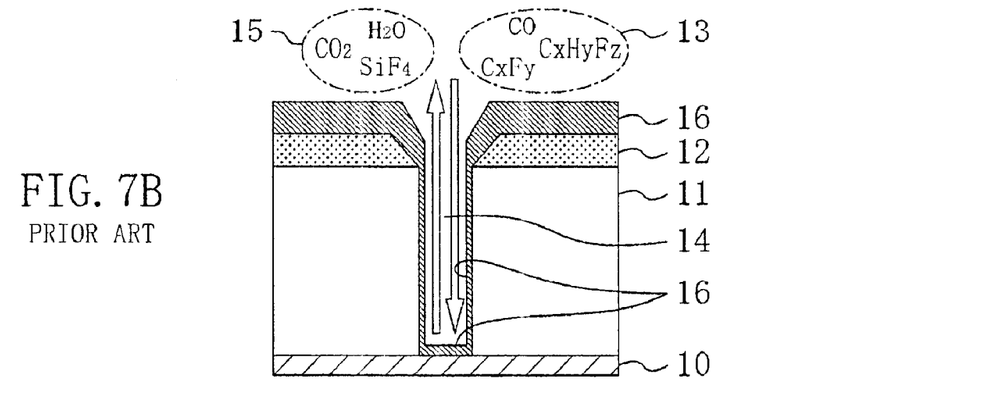

Next, as shown in FIG. 7B, an etching gas 13 including a fluorocarbon gas as a principal constituent is introduced into an etching chamber (not shown), so as to etch the silicon oxide film 11 by using the resist pattern 12 as a mask. In this manner, a contact hole 14 is formed in the silicon oxide film 11. Thus, a reaction product gas 15 of $SiF_4$, $CO_2$, $H_2O$ and others is generated and vaporized. At this point, a rigid polymer film 16 of $(C_xH_yF_z)_n$ including, as a principal constituent, carbon or fluorine supplied from the plasma of the etching gas 13 is deposited on the top surface of the resist pattern 12, the bottom and the wall of the contact hole 14 and the inside wall of the etching chamber.

Figure 7C:
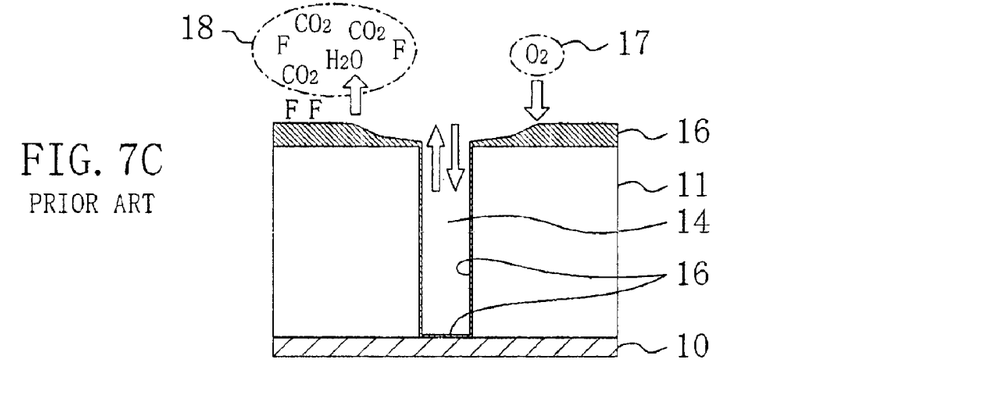

Then, as shown in FIG. 7C, an ashing gas 17 of an oxygen gas including a fluorocarbon gas is introduced into an ashing chamber (not shown), so as to ash the polymer film 16. Thus, oxygen activated by plasma generation power is bonded to carbon, that is, one principal constituent of the polymer film 16 so as to generate carbon dioxide, and fluorine is also vaporized. These gases are removed as a reaction product gas 18.

Figure 8A:
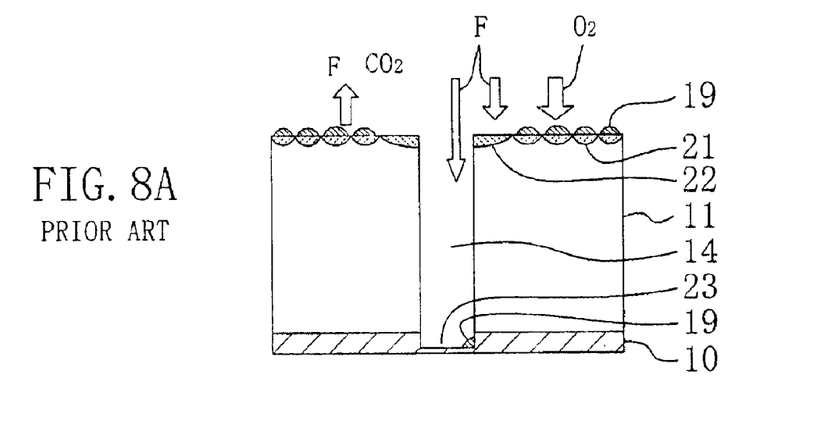
FIGS. 8A, 8B and 8C are cross-sectional views for showing other procedures in the method for fabricating a semiconductor device.

At this point, a residual polymer 19 is formed on the silicon oxide film 11 as shown in FIG. 8A. A large amount of activated oxygen with high energy is generated by the plasma generation power and the thus generated activated oxygen with high energy reaches the surface of the silicon oxide film 11. Therefore, fluorine included in the residual polymer 19 is concentrated and pushed into a surface portion of the silicon oxide film 11 by the activated oxygen reaching the surface of the silicon oxide film 11. As a result, a first fluorine implant layer 21 is formed in the surface portion of the silicon oxide film 11. Also, gas-phase fluorine included in the reaction product gas 18 is activated by the plasma generation power and reaches again the surface of the silicon oxide film 11, and then is implanted into a surface portion of the silicon oxide film 11. Therefore, a second fluorine implant layer 22 is formed in the surface portion of the silicon oxide film 11.

Furthermore, at this point, fluorine included in the polymer film 16 adhered onto the resist pattern 12 or included in the polymer film adhered onto the inside wall of the chamber and fluorine included in fluorocarbon added to the ashing gas also enters to reach the bottom of the contact hole 14. Therefore, a portion of the underlying layer 10 exposed within the contact hole 14 is etched to form a recess 23.

Figure 8B:
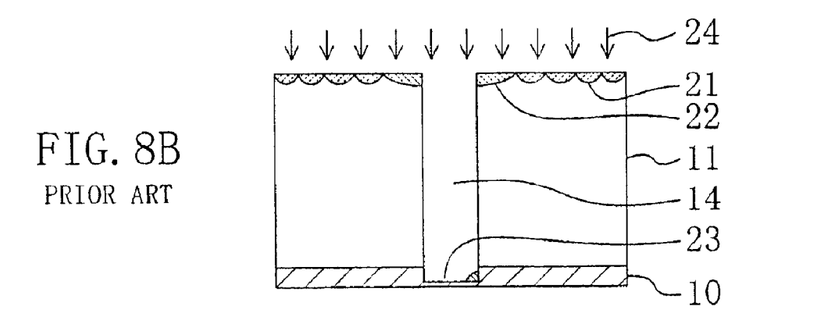

Next, as shown in FIG. 8B, the surface of the silicon oxide film 11 and the bottom of the contact hole 14 are wet cleaned with a cleaning agent 24, so as to remove the residual polymer 19.

Figure 8C:
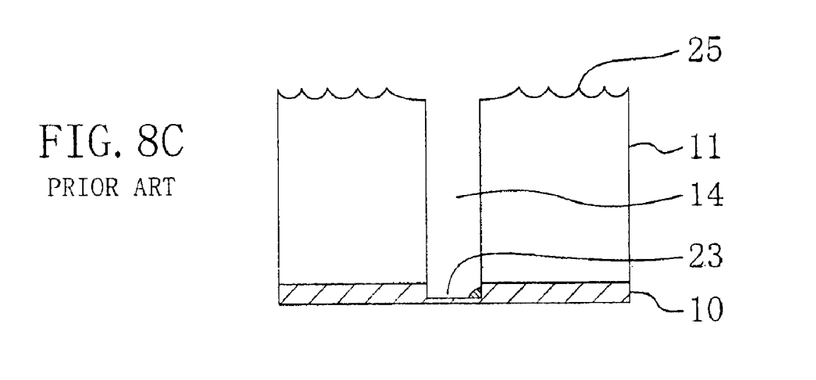

Thus, the residual polymer 19 present on the surface of the silicon oxide film 11 and on the bottom of the contact hole 14 is completely removed in the wet cleaning. However, there is a difference in the etching rate in the wet cleaning between the surface portions of the silicon oxide film 11 where the first fluorine implant layer 21 and the second fluorine implant layer 22 are formed and a surface portion thereof where none of these implant layers are formed. Accordingly, irregularities are caused in the surface portions of the silicon oxide film 11, which results in surface roughness 25 as shown in FIG. 8C.

Furthermore, in removing the residual polymer 19 present on the surface of the silicon oxide film 11 and on the bottom of the contact hole 14 by the ashing, if large plasma generation power is applied for the ashing in order to attain a sufficient ashing rate or to definitely remove the residual polymer 19, fluorine included in the residual polymer 19 or fluorine included in the polymer film deposited on the inside wall of the chamber strikes the surface of the silicon oxide film 11. As a result, the surface roughness 25 caused in the wet cleaning is further increased.

Moreover, when a large amount of fluorine enters to reach the bottom of the contact hole 14 during the ashing as described above so as to form the recess 23 in the underlying layer 10 exposed within the contact hole 14 (as shown in FIG. 8A), there arises a problem of increase of contact resistance if the underlying layer 10 is an impurity diffusion layer. Alternatively, if the underlying layer 10 is an etching stopper film, a metal interconnect formed below the etching stopper film is exposed, and hence, the metal interconnect is oxidized by oxygen plasma or absorbs moisture. As a result, there arises a problem of degradation in the device characteristic.

In addition, the fluorine included in the polymer film 16 (shown in FIG. 7C) deposited on the surface of the silicon oxide film 11 and the fluorine generated from the fluorocarbon gas added to the ashing gas is activated by the plasma during the ashing, so as to damage parts of the chamber. As a result, there arises a problem of a short life of the parts.

Furthermore, the fluorine having struck the surface of the silicon oxide film 11 during the ashing may not be completely removed but remain through the cleaning. In this case, when a resist film of a chemically amplified resist material is formed on the silicon oxide film 11 having the contact hole 14 and the resist film is subjected to pattern exposure, the fluorine included in the first and second fluorine implant layers 21 and 22 deactivates an acid generated in an exposed portion of the resist film. As a result, there arises a problem that a resist pattern cannot be formed in a good shape.

SUMMARY OF THE INVENTION

In consideration of the aforementioned conventional problems, an object of the invention is, in removing a polymer film, which has been deposited on a resist pattern during plasma etching of an insulating film using an etching gas including carbon and fluorine, by ashing before wet cleaning the insulating film, preventing surface roughness from being caused in the insulating film.

In order to achieve the object, the first method for fabricating a semiconductor device of this invention comprises the steps of forming a resist pattern on an insulating film deposited on a semiconductor substrate and subjecting the insulating film to plasma etching using an etching gas including carbon and fluorine with the resist pattern used as a mask; performing a first stage of ashing on a polymer film having been deposited on the resist pattern during the plasma etching with a relatively low chamber pressure and relatively low plasma generation power by using an oxygen gas or a gas including oxygen as a principal constituent; and performing a second stage of the ashing on a residual polymer present on the insulating film in completing the first stage of the ashing with relatively high chamber pressure and relatively high plasma generation power by using an oxygen gas or a gas including oxygen as a principal constituent.

In the first method for fabricating a semiconductor device, since the polymer film is subjected to the first stage of the ashing with a relatively low chamber pressure and relatively low plasma generation power, fluorine included in a reaction product gas generating at the first stage of the ashing is minimally activated and activated oxygen has low energy. Therefore, fluorine included in the polymer film is minimally pushed into a surface portion of the insulating film by the activated oxygen or the fluorine included in the reaction product gas is minimally implanted into a surface portion of the insulating film. Accordingly, surface roughness can be prevented from being caused on the insulating film through wet cleaning subsequently performed.

Furthermore, since the residual polymer is subjected to the second stage of the ashing with a relatively high chamber pressure and relatively high plasma generation power, a large amount of activated oxygen with high energy is generated. As a result, the residual polymer is efficiently removed.

Even though a large amount of activated oxygen with high energy is generated at the second stage of the ashing, since the amount of fluorine included in the residual polymer is small, the implantation of fluorine into a surface portion of the insulating film can be suppressed.

The first method for fabricating a semiconductor device preferably further comprises, after the step of performing a second stage of the ashing, a step of performing a third stage of the ashing with a relatively low chamber pressure and relatively high plasma generation power under application of substrate bias power by using an oxygen gas or a gas including oxygen as a principal constituent.

Thus, the activated oxygen with high energy is widely distributed and pulled toward a recess, such as a bottom of a contact hole, by the substrate bias power. Therefore, even when the recess has a high aspect ratio, the polymer film remaining on the bottom of the recess can be removed.

In the first method for fabricating a semiconductor device, the third stage of the ashing is preferably performed with the chamber pressure set to 2.67 through 6.67 Pa, the plasma generation power set to 1000 through 3000 W and the substrate bias power set to 50 through 300 W.

Thus, even when the recess has a high aspect ratio, the polymer remaining on the bottom of the recess can be definitely removed.

In the first method for fabricating a semiconductor device, the first stage of the ashing is preferably performed with the chamber pressure set to 2.67 through 6.67 Pa and the plasma generation power set to 500 through 1000 W.

Thus, fluorine included in the reaction product gas generated at the first stage of the ashing can be definitely made to be minimally activated as well as the energy of the activated oxygen can be definitely made low. As a result, the surface roughness derived from fluorine can be definitely prevented.

In the first method for fabricating a semiconductor device, the second stage of the ashing is preferably performed with the chamber pressure set to 13.3 through 66.7 Pa and the plasma generation power set to 1000 through 3000 W.

Thus, a large amount of activated oxygen with high energy can be generated, and hence, the residual polymer can be more efficiently removed.

The first method for fabricating a semiconductor device is particularly effective when the plasma etching, the first stage of the ashing and the second stage of the ashing are performed within the same chamber.

In a conventional technique, if the plasma etching and the ashing are performed within the same chamber, fluorine included in a polymer film having been deposited on the inside wall of the chamber during the plasma etching is activated through the ashing so as to cause a variety of harmful influences. In contrast, according to the invention, the fluorine included in the polymer film deposited on the inside wall of the chamber is minimally activated, and hence, the harmful influences can be avoided.

The second method for fabricating a semiconductor device of this invention comprises the steps of depositing an insulating film on an underlying layer formed on a semiconductor substrate and depositing a peeling layer on the insulating film; forming a resist pattern on the peeling layer and subjecting the peeling layer and the insulating film to plasma etching using an etching gas including carbon and fluorine with the resist pattern used as a mask; performing ashing on a polymer film having been deposited on the resist pattern during the plasma etching by using an oxygen gas or a gas including oxygen as a principal constituent; and removing the peeling layer having, in a surface portion thereof, a fluorine implant layer having been formed during the ashing.

In the second method for fabricating a semiconductor device, since the peeling layer is formed on the insulating film, fluorine included in the polymer film is implanted into the peeling layer but not implanted into the insulating film below. Also, the fluorine implant layer formed in the surface portion of the peeling layer is completely removed together with the peeling layer. Accordingly, surface roughness derived from fluorine is never caused in the insulating film through wet cleaning subsequently performed.

Furthermore, since the fluorine implant layer is completely removed, in the case where a resist film of a chemically amplified resist material is formed on the insulating film after removing the peeling layer and the resist film is subjected to pattern exposure, an acid generated in an exposed portion of the resist film can be avoided from being deactivated through a reaction between an acid ($H^+$) included in the chemically amplified resist material and fluorine.

In the second method for fabricating a semiconductor device, it is preferred that the insulating film is made from a silicon oxide film doped with no impurity, and that the peeling layer is made from a silicon oxide film doped with at least one impurity of boron, phosphorus and fluorine.

Thus, in removing the peeling layer through cleaning, selectivity against the insulating film can be attained, so that the peeling layer can be definitely removed.

In the second method for fabricating a semiconductor device, it is preferred that the insulating film is made from a silicon oxide film, and that the peeling layer is made from a silicon nitride film.

Thus, in removing the peeling layer through cleaning, selectivity against the insulating film can be attained, so that the peeling layer can be definitely removed.

In the second method for fabricating a semiconductor device, it is preferred that the underlying layer is made from a silicon nitride film, that the insulating film is made from a silicon oxide film, and that the peeling layer is made from a silicon film.

Thus, in removing the peeling layer through cleaning, selectivity against the insulating film can be attained, so that the peeling layer can be definitely removed. Also, the underlying layer can be prevented from being etched in removing the peeling layer.

The third method for fabricating a semiconductor device of this invention comprises the steps of depositing an insulating film on an underlying layer formed on a semiconductor substrate and depositing, on the insulating film, an implant stopper layer made from an insulating material harder than a material of the insulating film; forming a resist pattern on the implant stopper layer and subjecting the implant stopper layer and the insulating film to plasma etching using an etching gas including carbon and fluorine with the resist pattern used as a mask; performing ashing on a polymer film having been deposited on the resist pattern during the plasma etching by using an oxygen gas or a gas including oxygen as a principal constituent; and removing a fluorine implant layer having been formed in a surface portion of the implant stopper layer during the ashing.

In the third method for fabricating a semiconductor device, since the implant stopper layer is deposited on the insulating film, fluorine included in the polymer film is implanted into the implant stopper layer but not implanted into the insulating film. Furthermore, since the implant stopper layer is made from an insulating material harder than a material of the insulating film, fluorine generated from the polymer film is implanted into merely a shallow region but not implanted into a deep region in a surface portion of the implant stopper layer. Therefore, after removing the fluorine implant layer, surface roughness caused on the implant stopper layer is small. As a result, surface roughness derived from fluorine is never caused in the insulating film in wet cleaning subsequently performed.

Moreover, since the fluorine implant layer is removed, in the case where a resist film of a chemically amplified resist material is formed on the insulating film and the resist film is subjected to pattern exposure, an acid generated in an exposed portion of the resist film can be avoided from being deactivated through a reaction between an acid ($H^+$) included in the chemically amplified resist material and fluorine.

DETAILED DESCRIPTION OF THE INVENTION

Preferred embodiments of a method for fabricating a semiconductor device according to the invention will be now described, and a plasma processing system used in the method for fabricating a semiconductor device of each embodiment will be described beforehand with reference to FIG. 1.

Figure 1:
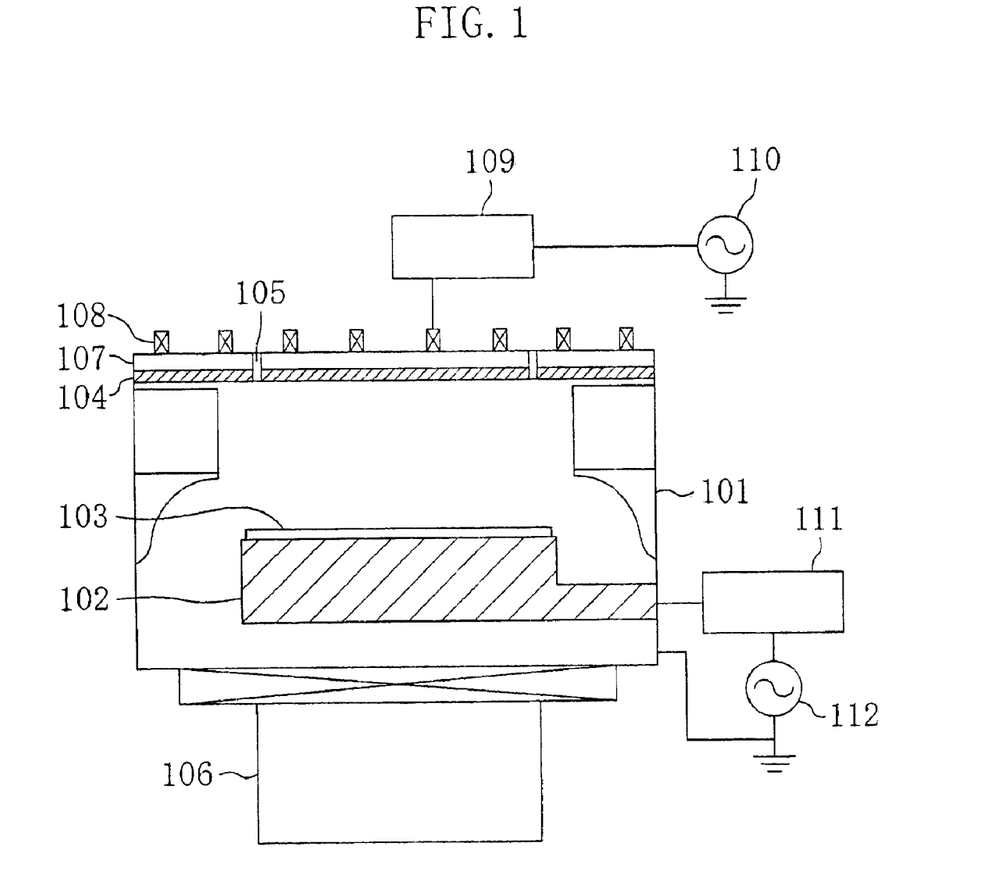
FIG. 1 is a cross-sectional view of a plasma processing system used in a method for fabricating a semiconductor device according to each embodiment of the invention.

FIG. 1 shows the cross-sectional structure of the plasma processing system, in which a lower electrode 102 serving as a sample table is disposed in a lower portion of a chamber 101, and the lower electrode 102 holds a semiconductor substrate 103 through electrostatic adsorption. An upper electrode 104 is disposed in an upper portion of the chamber 101 so as to oppose the lower electrode 102, and an etching gas is introduced into the chamber 101 through a gas inlet 105 formed in the upper electrode 104. Also, a gas present within the chamber 101 is discharged to the outside by a vacuum pump 106 disposed below the chamber 101.

A plasma induction coil 108 is disposed above the chamber 101 with an insulator 107 sandwiched therebetween, and one end of the plasma induction coil 108 is connected to a first RF power supply 110 through a first rectifier 109 with the other end thereof grounded. Also, the lower electrode 102 is connected to a second RF power supply 112 through a second rectifier 111.

When first RF power is applied to the plasma induction coil 108 by the first RF power supply 110, a high frequency induction magnetic field is caused in the chamber 101, so as to change an etching gas introduced to the chamber 101 into plasma. Also, when second RF power is applied to the lower electrode 102 by the second RF power supply 112, the plasma generated within the chamber 101 is made to irradiate the lower electrode 102, namely, the semiconductor substrate 103.

Embodiment 1

A method for fabricating a semiconductor device according to Embodiment 1 of the invention will now be described with reference to FIGS. 2A through 2C and 3A through 3C.

Figure 2A:
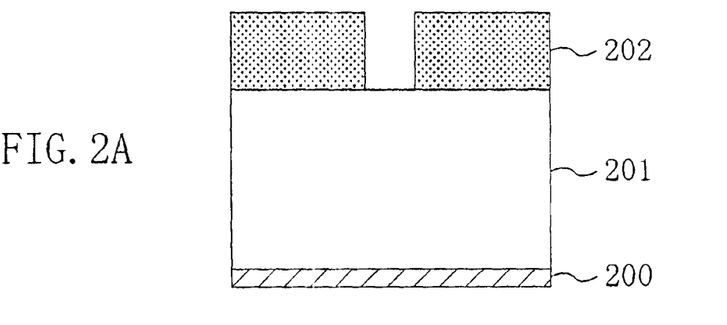
FIGS. 2A, 2B and 2C are cross-sectional views for showing procedures in a method for fabricating a semiconductor device according to Embodiment 1 of the invention.

First, as shown in FIG. 2A, an insulating film 201 of a silicon oxide film is deposited on an underlying layer 200 made from, for example, an etching stopper film of a silicon nitride film or the like, a plug of polysilicon, tungsten or the like, or a lower interconnect. Thereafter, a resist pattern 202 having a contact hole opening is formed on the insulating film 201.

Figure 2B:
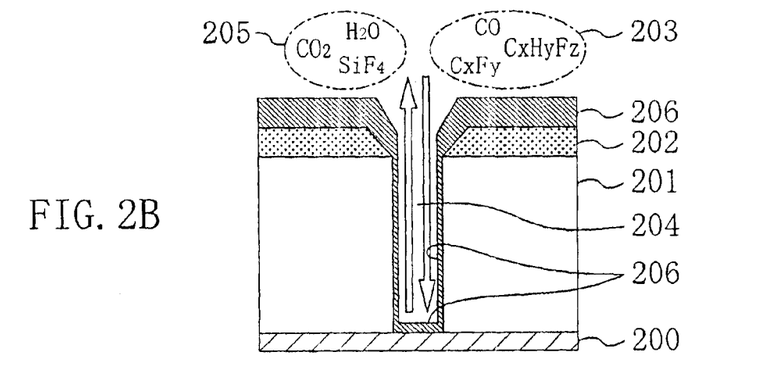

Next, an etching gas 203 including a fluorocarbon gas as a principal constituent is introduced into the chamber 101 of the plasma processing system of FIG. 1, and the insulating film 201 is plasma etched by using the resist pattern 202 as a mask as shown in FIG. 2B, so as to form a contact hole 204 in the insulating film 201. Thus, a reaction product gas 205 of $SiF_4$, $CO_2$, $H_2O$ and others is generated and vaporized. At this point, a rigid polymer film 206 of $(C_xH_yF_z)_n$ including, as a principal constituent, carbon or fluorine supplied from plasma of the etching gas 203 is deposited on the top surface of the resist pattern 202, the bottom and the wall of the contact hole 204 and the inside wall of the chamber 101.

Figure 2C:
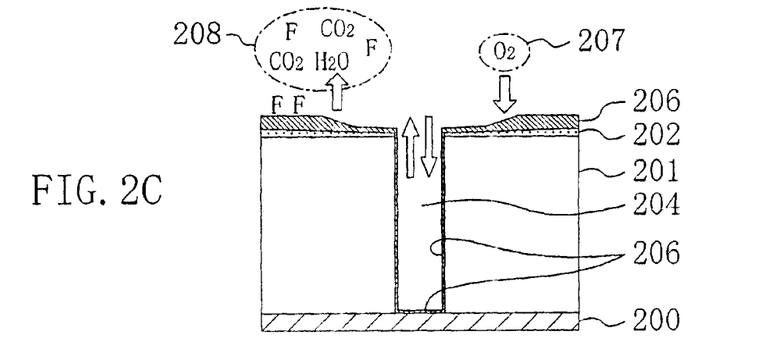

Then, an ashing gas 207 of an oxygen gas including a fluorocarbon gas is introduced into the chamber 101, so as to ash the polymer film 206 as shown in FIG. 2C. At this point, oxygen activated by plasma generation power is bonded to carbon, that is, one principal constituent of the polymer film 206, so as to generate carbon dioxide, and fluorine is also vaporized. These gases are removed as a reaction product gas 208.

As a characteristic of Embodiment 1, the ashing is performed in three stages under different conditions as follows:
<First Stage of Ashing>

At the first stage of the ashing, the plasma generation power is set low and the pressure within the chamber is set low. Specifically, an ashing gas including an oxygen gas as a principal constituent is introduced at a flow rate of 750 ml/min. (standard condition) into the chamber 101 in which the pressure is set to 6.67 Pa or lower, for example, to 4.0 Pa, and power of 500 W through 1000 W is applied to the first RF power supply 110 working as a plasma generation power supply. In this case, no power is applied to the second RF power supply 112 working as a substrate bias power supply.

When the first stage of the ashing is performed under these conditions, the polymer film 206 and the resist pattern 202 are removed and the polymer film adhered onto the inside wall of the chamber 101 is also removed. Although the polymer film 206 is deposited on the resist pattern 202, the resist pattern 202 is also ashed because the ashing gas reaches the surface of the resist pattern 202 through an opening formed in the polymer film 206.

At this point, the polymer film 206 and the resist pattern 202 are removed by the ashing through the following chemical reactions:

(1) Reaction for removing polymer film 206 through ashing:

$C_xF_y + O_2 \rightarrow CO_2\uparrow + F\uparrow + CF_4\uparrow$ + reaction product The reaction product includes carbide, excessive fluorine and the like and is deposited on the polymer film 206 or the resist pattern 202.

(2) Reaction for removing resist pattern 202 through ashing:

$C_xH_yO_z + O_2 \rightarrow CO_2\uparrow + H_2O\uparrow$

At the first stage of the ashing, since the low power of 500 W through 1000 W is applied to the first RF power supply 110, fluorine included in the reaction product gas 208 is minimally activated, and activated oxygen included in the ashing gas 207 has low energy. Also, since the pressure within the chamber 101 is set to a low pressure of 6.67 Pa or lower, the activated oxygen included in the ashing gas 207 has a long mean free path, and hence, the activated oxygen is widely distributed within the chamber 101.

Since the fluorine included in the reaction product gas 208 is thus minimally activated, it minimally reaches the surfaces of the polymer film 206 and the insulating film 201. Also, since the polymer film 206 is slowly removed from a surface portion thereof, the fluorine is minimally concentrated within the polymer film 206 as well as is minimally implanted into a surface portion of the insulating film 201. Accordingly, the first fluorine implant layer 21 and the second fluorine implant layer 22 as shown in FIG. 8A are not formed in surface portions of the insulating film 201.

Furthermore, although the activated oxygen included in the ashing gas 207 has low energy, the activated oxygen is widely distributed within the chamber 101, and hence, the amount of activated oxygen reaching the bottom of the contact hole 204 is increased. Therefore, the polymer film 206 deposited on the bottom of the contact hole 204 can be nearly removed.

Also, since the fluorine included in the reaction product gas 208 is minimally activated, the fluorine minimally reaches the bottom of the contact hole 204, and hence, the recess 23 as shown in FIG. 8A is not formed on the bottom of the contact hole 204.

In addition, since activated fluorine generated from the polymer film 206 is reduced because the amount of fluorine included in the polymer film 206 is thus small and the fluorine included in the reaction product gas 208 is minimally activated, parts of the chamber 101 are minimally damaged.

In general, the ashing rate of the polymer film 206 is lower than the ashing rate of the resist pattern 202. Therefore, the resist pattern 202 is removed preferentially to the polymer film 206 at the first stage of the ashing. Accordingly, the time for performing the first stage of the ashing is preferably determined depending upon the thickness of the polymer film 206. However, the resist pattern 202 is preferably present below the polymer film 206 as long as possible because a residual polymer remaining on the surface of the insulating film 201 in completing the first stage of the ashing can be thus reduced.

The behavior of the fluorine included in the reaction product gas 208 is herein described. In the case where the etching and the ashing are carried out in the same chamber 101 as in Embodiment 1, the fluorine included in the polymer film having been adhered onto the inside wall of the chamber 101 during the etching behaves in the same manner as the fluorine included in the reaction product gas 208. In other words, the polymer film adhered onto the inside wall of the chamber 101 is gradually ashed, and hence, the fluorine included in this polymer film is not vaporized in a large amount and is minimally activated. Therefore, the fluorine is minimally implanted into the surface portion of the insulating film 201 and minimally reaches the bottom of the contact hole 204. Accordingly, the first fluorine implant layer 21, the second fluorine implant layer 22 and the recess 23 as shown in FIG. 8A are never formed.

<Second Stage of Ashing>

Figure 3A:
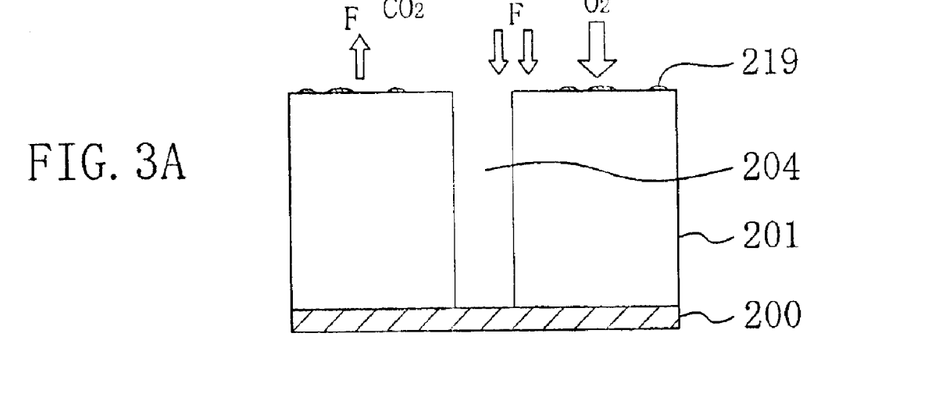
FIGS. 3A, 3B and 3C are cross-sectional views for showing other procedures in the method for fabricating a semiconductor device of Embodiment 1.

When most of the polymer film 206 is removed with a slight amount of a residual polymer 219 remaining on the insulating film 201 as shown in FIG. 3A, the first stage of the ashing is completed and the second stage of the ashing is started.

At the second stage of the ashing, the plasma generation power is set high and the pressure within the chamber is set high. Specifically, an ashing gas including an oxygen gas as a principal constituent is introduced at a flow rate of 500 ml/min. (standard condition) into the chamber 101 in which the pressure is set to, for example, 40 Pa, and power of 2000 W is applied to the first RF power supply 110 working as the plasma generation power supply. In this case, no power is applied to the second RF power supply 112 working as the substrate bias power supply.

At the second stage of the ashing, since the high power of 2000 W is applied to the first RF power supply 110 and the pressure within the chamber 101 is set to a high pressure of 40 Pa. Therefore, a large amount of activated oxygen with high energy is generated in the chamber 101, so that the polymer film 206 and the resist pattern 202 can be efficiently removed.

At the second stage of the ashing, since merely a slight amount of the residual polymer 219 remains on the insulating film 201, merely a small amount of fluorine is released from the residual polymer 219.

Therefore, even through a large amount of activated oxygen with high energy is generated at the second stage of the ashing, the implantation of the fluorine released from the residual polymer 219 into a surface portion of the insulating film 201 is suppressed. As a result, the first fluorine implant layer 21 as shown in FIG. 8A is never formed.

Furthermore, since merely a slight amount of the residual polymer 219 remains, merely a small amount of activated fluorine is generated in the chamber 101, and hence, the parts of the chamber 101 are minimally damaged.

In the case where the etching and the ashing are carried out in the same chamber 101 and the polymer film is deposited on the inside wall of the chamber 101 during the etching, the amount of the polymer film deposited on the inside wall of the chamber 101 is reduced through the first stage of the ashing. Therefore, even though the second stage of the ashing is carried out with the high plasma generation power and the high chamber pressure, the formation of the first fluorine implant layer 21 shown in FIG. 8A and the damage of the parts of the chamber 101 due to the fluorine generated from the polymer film having been deposited on the inside wall of the chamber 101 can be avoided.

<Third Stage of Ashing>

Figure 3B:
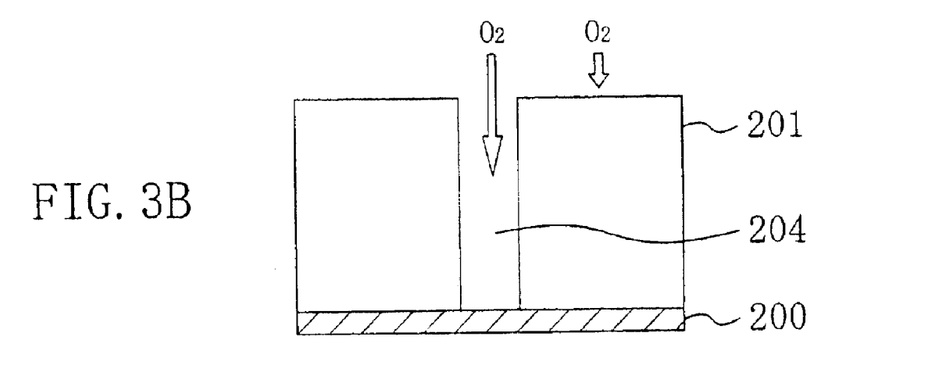

When the residual polymer 219 is removed as shown in FIG. 3B, the second stage of the ashing is completed and the third stage of the ashing is started.

At the third stage of the ashing, the plasma generation power is set high and the pressure within the chamber is set low as well as substrate bias power is applied to the sample table 102 by the second RF power supply 112. Specifically, an ashing gas including an oxygen gas as a principal constituent is introduced at a flow rate of 750 ml/min. (standard condition) into the chamber 101 in which the pressure is set to 6.67 Pa or lower, for example, to 4.0 Pa, power of 2000 W is applied to the first RF power supply 110 working as the plasma generation power supply, and power of 200 W is applied to the second RF power supply 112 working as the substrate bias power supply.

At the third stage of the ashing, the high power is applied to the first RF power supply 110 and the pressure within the chamber 101 is low, and therefore, activated oxygen with high energy is widely distributed in the chamber 101. Also, since the substrate bias power is applied, the activated oxygen is pulled toward the bottom of the contact hole 204. Therefore, even when the contact hole 204 has a high aspect ratio, the polymer film remaining on the bottom of the contact hole 204 can be completely removed.

Since the residual polymer 219 remaining on the insulating film 201 has been removed at the third stage of the ashing, substantially no fluorine is present within the chamber 101. Therefore, even though the substrate bias power is applied, the bottom of the contact hole 204 is never etched.

Figure 3C:
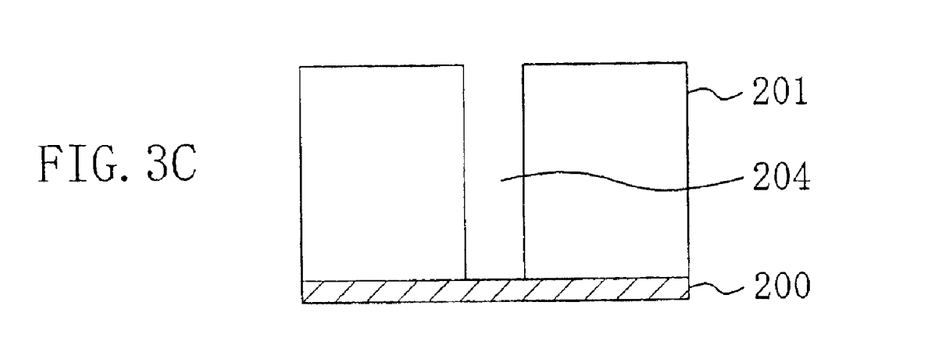

When the third stage of the ashing is completed, the surface of the silicon oxide film 201 and the bottom of the contact hole 204 are wet cleaned with a cleaning agent, so as to remove residues of the polymer film. Thus, the good insulating film 201 having no fluorine implant layer in its surface portion and the contact hole 204 in a good shape having no recess at its bottom can be formed as shown in FIG. 3C.

Although the ashing is carried out in the three stages in Embodiment 1, if the aspect ratio of the contact hole 204 is not very high or the underlying layer 200 is an etching stopper film and hence there arises no problem of contact resistance, the third stage of the ashing may be omitted.

In the case where the etching and the ashing are carried out in the same chamber 101 as in Embodiment 1, the polymer film having been deposited on the inside wall of the chamber 101 during the etching can be removed through the ashing for removing the polymer film 206 deposited on the resist pattern 202. Therefore, particles generated from the polymer dropping off from the inside wall of the chamber 101 can be reduced, so as to elongate MTBF (mean time between failure).

Figure 4:
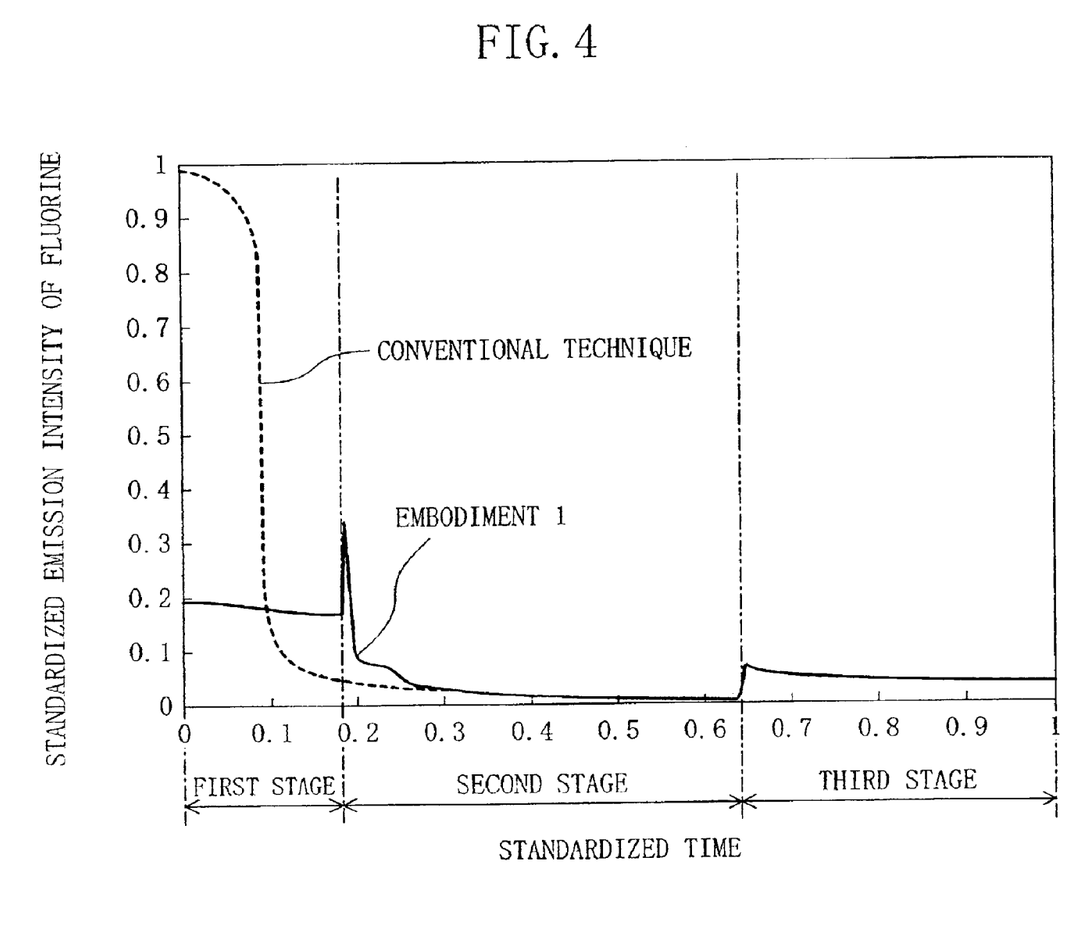
FIG. 4 is a characteristic diagram for showing change with time of emission intensity of fluorine in ashing performed in the method for fabricating a semiconductor device of Embodiment 1.

FIG. 4 is a characteristic diagram for showing change with time of standardized emission intensity of fluorine (having an emission wavelength of 440 nm) in conventional ashing (where the first stage of the ashing is carried out under the same conditions as those for the second stage of the ashing) and in the ashing of Embodiment 1 (where the first stage of the ashing is carried out under different conditions from those for the second stage of the ashing). The emission intensity of fluorine is measured with a plasma emission spectrometer.

As is understood from FIG. 4, the amount of fluorine generated at the beginning of the first stage of the ashing can be reduced to approximately $\frac{1}{5}$ in the ashing of Embodiment 1 as compared with that in the conventional ashing. Therefore, the amount of fluorine generated during the whole ashing can be reduced to approximately ⅓. This is because the amount of fluorine that is generated from the polymer film 206 deposited on the silicon oxide film 202 and the polymer film deposited on the inside wall of the chamber 101 and activated by the plasma generation power can be largely reduced.

Although the inductively coupled plasma processing system is used in Embodiment 1, another plasma processing system, such as a helicon plasma etching system, an electron cyclotron resonance plasma etching system, a two-frequency type capacitively coupled plasma etching system, a surface wave plasma etching system and a one-frequency type capacitively coupled plasma etching system, may be used instead.

Embodiment 2

A method for fabricating a semiconductor device according to Embodiment 2 of the invention will now be described with reference to FIGS. 5A through 5D.

Figure 5A:
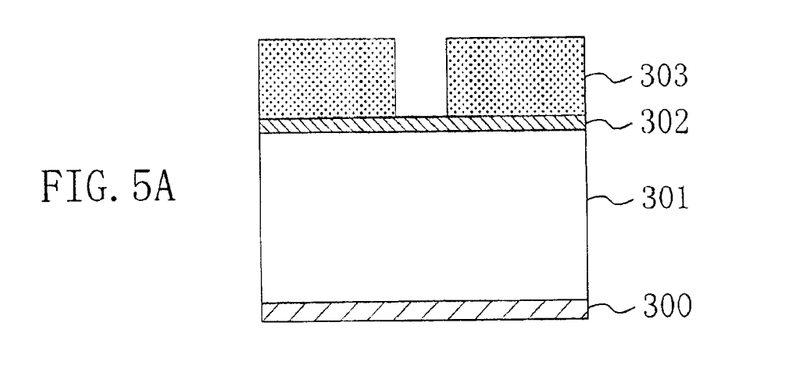
FIGS. 5A, 5B, 5C and 5D are cross-sectional views for showing procedures in a method for fabricating a semiconductor device according to Embodiment 2 or modification thereof of the invention.

First, as shown in FIG. 5A, an insulating film 301 of a silicon oxide film (which may be or may not be doped with an impurity such as boron, phosphorus or fluorine) is deposited on a silicon substrate 300 serving as an underlying layer. Thereafter, a peeling layer 302 of, for example, a silicon nitride film with a thickness of approximately 10 nm through 50 nm is deposited on the insulating film 301.

Figure 5B:
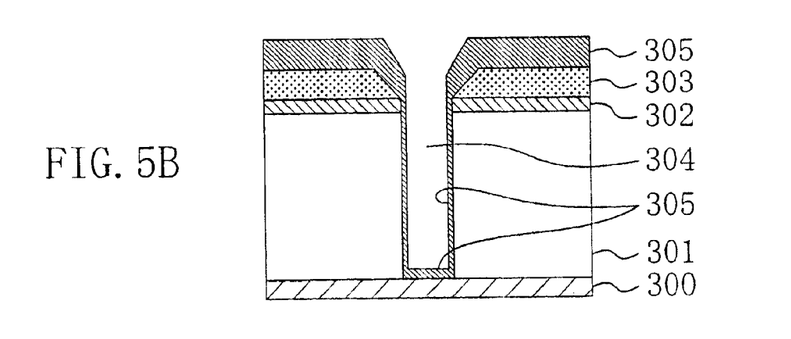

Next, a resist pattern 303 having a contact hole opening is formed on the peeling layer 302. Thereafter, the peeling layer 302 and the insulating film 301 are subjected to plasma etching using an etching gas of a fluorocarbon gas with the resist pattern 303 used as a mask, thereby forming a contact hole 304 as shown in FIG. 5B. Thus, a rigid polymer film 305 including, as a principal constituent, carbon or fluorine supplied from plasma of the etching gas is deposited on the top surface of the resist pattern 303 and the bottom and the wall of the contact hole 304.

Figure 5C:
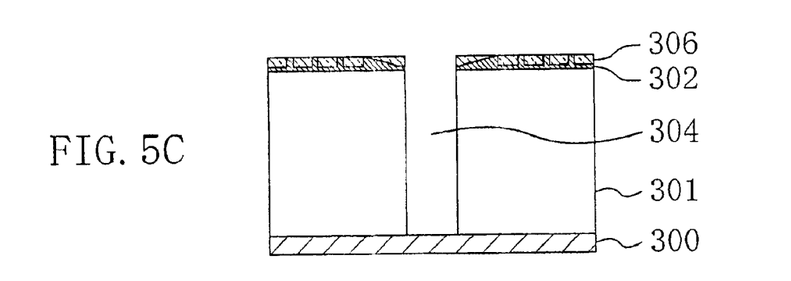

Then, the polymer film 305 and the resist pattern 303 are ashed by using an ashing gas of an oxygen gas including fluorocarbon. Thus, fluorine having been generated from the polymer film 305 and activated by the plasma is implanted into the peeling layer 302. Therefore, a fluorine implant layer 306 is formed in a surface portion of the peeling layer 302 but no fluorine is implanted into the insulating film 301 as shown in FIG. 5C.

Figure 5D:
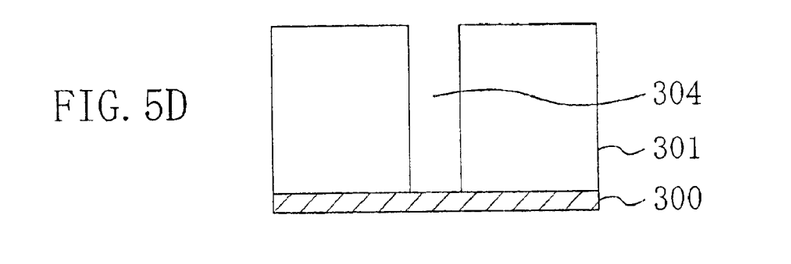

Thereafter, the peeling layer 302 is removed through wet cleaning with hydrofluoric acid. Thus, the fluorine implant layer 306 is removed together with the peeling layer 302, and hence, the insulating film 301 in which no fluorine has been implanted can be obtained as shown in FIG. 5D. In this case, since hydrofluoric acid is used as the cleaning agent, the peeling layer 302 of a silicon nitride film has selectivity in the wet cleaning against the silicon substrate 300, and hence, the peeling layer 302 can be removed without etching the bottom of the contact hole 304.

According to Embodiment 2, since the peeling layer 302 is formed on the insulating film 301, the fluorine included in the polymer film 305 is implanted into the peeling layer 302 but not implanted into the insulating film 301. Also, the fluorine implant layer 305 formed in the surface portion of the peeling layer 302 is completely removed together with the peeling layer 302. Therefore, surface roughness derived from fluorine is never caused in the insulating film 301 through the wet cleaning.

Furthermore, since the fluorine implant layer 305 is completely removed, in the case where a resist film of a chemically amplified resist material is formed on the insulating film 301 after removing the peeling layer 302 and the resist film is subjected to pattern exposure, an acid generated in an exposed portion of the resist film can be avoided from being deactivated through a reaction between an acid (H$^+$) included in the chemically amplified resist material and fluorine.

Although the silicon substrate 300 serving as the underlying layer is exposed on the bottom of the contact hole 304 in Embodiment 2, even when an electrode of a polysilicon film is present as the underlying layer, the peeling layer 302 of a silicon nitride film can be removed by using phosphoric acid.

Furthermore, in the case where an etching stopper of a silicon nitride film is exposed as the underlying layer on the bottom of the contact hole 304, a polysilicon film with a small thickness of approximately 10 through 30 nm or a silicon oxide nitrided film with a thickness of approximately 10 through 50 nm is preferably used as the peeling layer 302.

In the case where a polysilicon film is used as the peeling layer 302, potassium hydroxide may be used as the cleaning agent. Alternatively, in the case where a silicon oxide nitrided (SiON) film is used as the peeling layer 302, hydrofluoric acid may be used. However, in this case, since selectivity of a silicon oxide nitrided film against a silicon nitride film is not very high, the peeling layer 302 is preferably formed in a small thickness.

Modification of Embodiment 2

A method for fabricating a semiconductor device according to a modification of Embodiment 2 of the invention will now be described with reference to FIGS. 5A through 5D.

First, as shown in FIG. 5A, an insulating film 301 of a silicon oxide film not doped with an impurity such as boron, phosphorus or fluorine is deposited on a silicon substrate 300 serving as an underlying layer. Thereafter, a peeling layer 302 of a silicon oxide film doped with at least one impurity of boron, phosphorus and fluorine with a thickness of, for example, approximately 10 mm through 50 nm is deposited on the insulating film 301.

Next, after forming a resist pattern 303 having a contact hole opening on the peeling layer 302, the peeling layer 302 and the insulating film 301 are subjected to plasma etching using an etching gas of a fluorocarbon gas with the resist pattern 303 used as a mask, so as to form a contact hole 304 as shown in FIG. 5B.

Thus, a rigid polymer film 305 including, as a principal constituent, carbon or fluorine supplied from plasma of the etching gas is deposited on the top surface of the resist pattern 303 and the bottom and the wall of the contact hole 304.

This plasma etching is carried out on the insulating film 301 doped with no impurity and the peeling layer 302 made from a silicon oxide film doped with an impurity, the etching can be eased.

Next, the polymer film 305 and the resist pattern 303 are ashed by using an ashing gas of an oxygen gas including fluorocarbon. Thus, fluorine having been generated from the polymer film 305 and activated by the plasma is implanted into the peeling layer 302. Therefore, a fluorine implant layer 306 is formed in a surface portion of the peeling layer 302 but no fluorine is implanted into the insulating film 301 as shown in FIG. 5C.

Then, the fluorine implant layer 306 is removed together with the peeling layer 302 through wet cleaning using hydrofluoric acid. Thus, since the peeling layer 302 made from a silicon oxide film has selectivity in the wet cleaning against the silicon substrate 300, the peeling layer 302 can be removed without etching the bottom of the contact hole 304.

According to the modification of Embodiment 2, since the peeling layer 302 is formed on the insulating film 301, the fluorine included in the polymer film 305 is implanted into the peeling layer 302 but not implanted into the insulating film 301. Also, the fluorine implant layer 306 formed in the surface portion of the peeling layer 302 is completely removed together with the peeling layer 302. Therefore, surface roughness derived from fluorine is not caused in the insulating film 301 through the wet cleaning.

Furthermore, since the fluorine implant layer 306 is completely removed, in the case where a resist film of a chemically amplified resist material is formed on the insulating film 301 after removing the peeling layer 302 and the resist film is subjected to pattern exposure, an acid generated in an exposed portion of the resist film can be avoided from being deactivated through a reaction between an acid ($H^+$) included in the chemically amplified resist material and fluorine.

Although the peeling layer 302 is removed by the wet cleaning using hydrofluoric acid in the modification of Embodiment 2, the peeling layer 302 may be removed by using gas phase hydrofluoric acid instead.

Also, although the silicon substrate 300 is exposed as the underlying layer on the bottom of the contact hole 304 in the modification of Embodiment 2, an etching stopper of a silicon nitride film or an electrode of a polysilicon film may be exposed instead as the underlying film on the bottom of the contact hole 304.

Embodiment 3

A method for fabricating a semiconductor device according to Embodiment 3 of the invention will now be described with reference to FIGS. 6A through 6D.

Figure 6A:
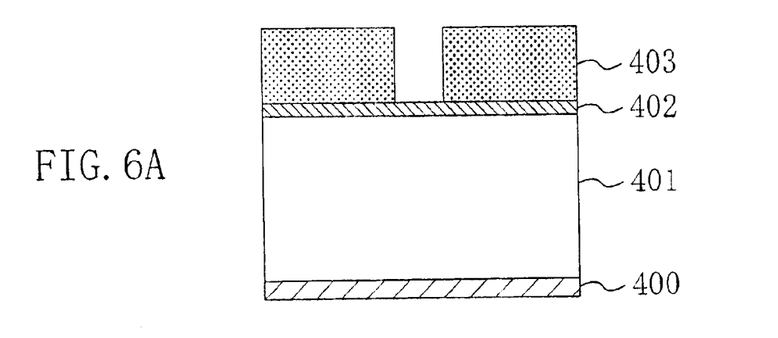
FIGS. 6A, 6B, 6C and 6D are cross-sectional views for showing procedures in a method for fabricating a semiconductor device according to Embodiment 3 of the invention.

First, as shown in FIG. 6A, an insulating film 401 of a silicon oxide film (for example, a BPSG film or an FSG film) doped with at least one impurity of boron, phosphorus and fluorine is deposited on a silicon substrate 400 serving as an underlying layer. Thereafter, an implant stopper layer 402 made from a hard silicon oxide film doped with no impurity with a thickness of approximately 10 through 50 nm is deposited on the insulating film 401. Examples of the hard silicon oxide film are a plasma TEOS film and an HDP-NSG film (a non-doped silicate glass film deposited with high density plasma). In the case where the insulating film 401 and the implant stopper layer 402 are both made from a silicon oxide film, they can be continuously formed and hence the number of procedures can be reduced.

Figure 6B:
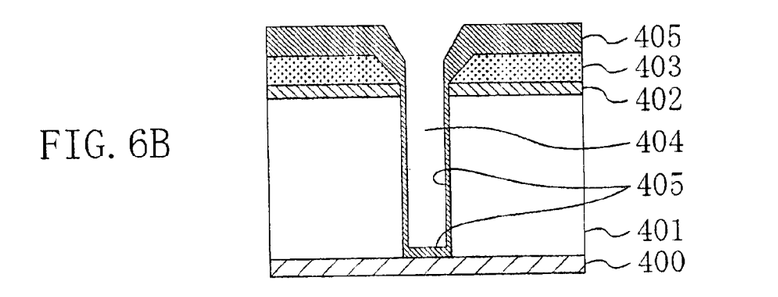

Next, after forming a resist pattern 403 having a contact hole opening on the implant stopper layer 402, the implant stopper layer 402 and the insulating film 401 are subjected to plasma etching using an etching gas of fluorocarbon with the resist pattern 403 used as a mask, so as to form a contact hole 404 as shown in FIG. 6B. Thus, a rigid polymer film 403 including, as a principal constituent, carbon or fluorine supplied from plasma of the etching gas is deposited on the top surface of the resist pattern 403 and the bottom and the wall of the contact hole 404.

This plasma etching is carried out on the insulating film 401 made from a silicon oxide film doped with an impurity and the implant stopper layer 402 made from a silicon oxide film not doped with an impurity, and hence, the etching can be eased.

Figure 6C:
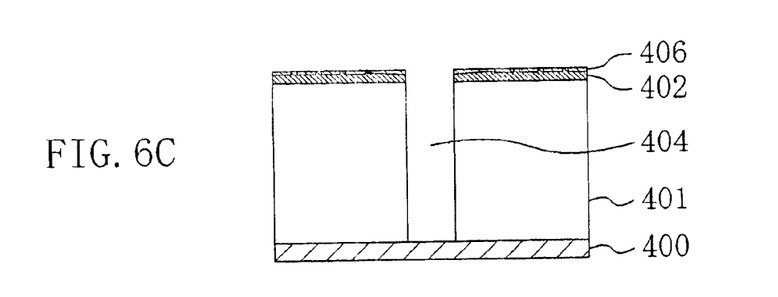

Then, the polymer film 405 and the resist pattern 403 are ashed by using an ashing gas of an oxygen gas including fluorocarbon. Thus, fluorine having been generated from the polymer film 405 and activated by the plasma is implanted into the implant stopper layer 402. Therefore, a fluorine implant layer 406 is formed in a surface portion of the implant stopper layer 402 as shown in FIG. 6C. However, the implantation depth of the fluorine (namely, the thickness of the fluorine implant layer 405) is small because the implant stopper layer 402 includes no impurity and is hard, and no fluorine is implanted into the insulating film 401.

Figure 6D:
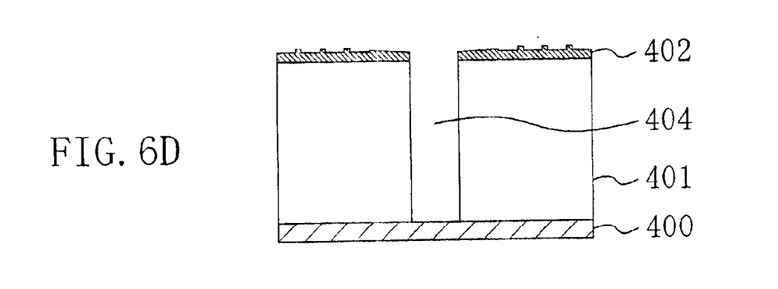

Next, as shown in FIG. 6D, the fluorine implant layer 406 is removed through wet cleaning using weak hydrofluoric acid or a mixed solution of ammonia water and hydrogen peroxide in such a manner that no step is formed between the insulating film 401 and the implant stopper layer 402 exposed within the contact hole 404. In this wet cleaning, the fluorine implant layer 406 is principally removed owing to a difference in the etching rate between the fluorine implant layer 406 and the implant stopper layer 402 made from a silicon oxide film doped with no impurity.

According to Embodiment 3, the implant stopper layer 402 made from a hard silicon oxide film doped with no impurity is formed on the insulating film 401 doped with an impurity. Therefore, the fluorine generated from the polymer film 405 is implanted into merely a shallow region but not implanted into a deep region in the surface portion of the implant stopper layer 402. Accordingly, after removing the fluorine implant layer 406 through the wet cleaning, surface roughness caused on the implant stopper layer 402 is small.

Furthermore, since the fluorine implant layer 406 is removed, in the case where a resist film of a chemically amplified resist material is formed on the insulating film 401 and the resist film is subjected to pattern exposure, an acid generated in an exposed portion of the resist film can be avoided from being deactivated through a reaction between an acid ($H^+$) included in the chemically amplified resist material and fluorine.

Although the silicon substrate 400 is exposed as the underlying layer on the bottom of the contact hole 404 in Embodiment 3, an etching stopper of a silicon nitride film, an electrode of a polysilicon film or an interconnect of a metal film may be exposed instead as the underlying layer on the bottom of the contact hole 404.

In the case where the peeling layer or the fluorine implant layer is difficult to remove through the wet cleaning, surface polishing by CMP is effective.

What is claimed is:

1. A method for fabricating a semiconductor device comprising the steps of:

forming a resist pattern on an insulating film deposited on a semiconductor substrate and subjecting said insulating film to plasma etching using an etching gas including carbon and fluorine with said resist pattern used as a mask;

performing a first stage of ashing on said resist pattern and a polymer film derived from said etching gas and having been deposited on said resist pattern with a relatively low chamber pressure and relatively low plasma generation power by using a first ashing gas composed of an oxygen gas or a gas including oxygen as a principal constituent; and performing a second stage of the ashing on a residual polymer present on said insulating film in completing said first stage of the ashing with relatively high chamber pressure and relatively high plasma generation power by using a second ashing gas composed of an oxygen gas or a gas including oxygen as a principal constituent, wherein said resist pattern is removed during the step of performing said first stage of ashing, said first stage of ashing is performed under a chamber pressure of 6.67 Pa or less, and said second stage of ashing is performed under a chamber pressure of 6.67 Pa or more.

2. The method for fabricating a semiconductor device of claim 1, further comprising, after the step of performing a second stage of the ashing, a step of performing a third stage of the ashing with a relatively low chamber pressure and relatively high plasma generation power under application of substrate bias power by using a third ashing gas composed of an oxygen gas or a gas including oxygen as a principal constituent.

3. The method for fabricating a semiconductor device of claim 2, wherein said third stage of the ashing is performed with said chamber pressure set to 2.67 through 6.67 Pa, said plasma generation power set to 1000 through 3000 W and said substrate bias power set to 50 through 300 W.

4. The method for fabricating a semiconductor device of claim 1, wherein said first stage of the ashing is performed with said chamber pressure set to 2.67 through 6.67 Pa and said plasma generation power Set to 500 through 1000 W.

5. The method for fabricating a semiconductor device of claim 1, wherein said second stage of the ashing is performed with said chamber pressure set to 13.3 through 66.7 Pa and said plasma generation power set to 1000 through 3000 W.

6. The method for fabricating a semiconductor device of claim 1, wherein said plasma etching, said first stage of the ashing and said second stage of the ashing are performed within the same chamber.

7. The method for fabricating a semiconductor device of claim 1, wherein said insulating film is composed of an inorganic material.

8. The method for fabricating a semiconductor device of claim 1, wherein said first ashing gas and said second ashing gas are an oxygen gas including a fluorocarbon gas.

9. A method for fabricating a semiconductor device comprising the steps of:

depositing an insulating film on an underlying layer formed in a semiconductor substrate and depositing a peeling layer on said insulating film;

forming a resist pattern on said peeling layer and subjecting said peeling layer and said insulating film to plasma etching using an etching gas including carbon and fluorine with said resist pattern used as a mask;

performing ashing on a polymer film derived from said etching gas and having been deposited on said resist pattern by using an ashing gas composed of an oxygen gas or a gas including oxygen as a principal constituent; and following said ashing step, removing said peeling layer having, in a surface portion thereof, a fluorine implant layer having been formed during said ashing, wherein the step of removing said peeling layer includes a sub-step of removing said peeling layer by wet cleaning.

10. The method for fabricating a semiconductor device of claim 9, wherein said insulating film is made from a silicon oxide film doped with no impunty, and said peeling layer is made from a silicon oxide film doped with at least one impurity of boron, phosphorus and fluorine.

11. The method for fabricating a semiconductor device of claim 9, wherein said insulating film is made from a silicon oxide film, and said peeling layer is made from a silicon nitride film.

12. The method for fabricating a semiconductor device of claim 9, wherein said underlying layer is made from a silicon nitride film, said insulating film is made from a silicon oxide film, and said peeling layer is made from a silicon film.

13. The method for fabricating a semiconductor device of claim 9, wherein in the step of removing said peeling layer, said peeling layer has selectivity against said semiconductor substrate.

14. A method for fabricating a semiconductor device comprising the steps of:

depositing an insulating film on an underlying layer formed in a semiconductor substrate and depositing, on said insulating film, an implant stopper layer made from an insulating material harder than a material of said insulating film;

forming a resist pattern on said implant stopper layer and subjecting said implant stopper layer and said insulating film to plasma etching using an etching gas including carbon and fluorine with said resist pattern used as a mask;

performing ashing on a polymer film derived from said etching gas and having been deposited on said resist pattern by using mi oxygen gas or a gas including oxygen as a principal constituent; and following said ashing step, removing a fluorine implant layer having been formed in a surface portion of said implant stopper layer during said ashing.

wherein the step of removing said fluorine implant layer includes a sub-step of removing said fluorine implant layer by wet cleaning.

15. The method for fabricating a semiconductor device of claim 14, wherein in the step of removing said flourine implant layer, said implant stopper layer has selectivity against said semiconductor substrate.

* * * * *